United States Patent
Le Traon et al.

(10) Patent No.: US 7,448,268 B2
(45) Date of Patent: Nov. 11, 2008

(54) MECHANICAL DECOUPLING DEVICE FOR MONOLITHIC DIFFERENTIAL VIBRATING SENSOR

(75) Inventors: Olivier Le Traon, Vauhallan (FR); Marc Pernice, Fresnes (FR); Denis Janiaud, Les Ulis (FR); Bernard Lecorre, Meudon la Foret (FR); Serge Muller, Forges les Bains (FR)

(73) Assignee: Onera, Chatillon (FR)

( * ) Notice: Subject to any disclaimer, the term of this patent is extended or adjusted under 35 U.S.C. 154(b) by 194 days.

(21) Appl. No.: 11/568,644

(22) PCT Filed: Apr. 21, 2005

(86) PCT No.: PCT/FR2005/000988

§ 371 (c)(1),
(2), (4) Date: Nov. 3, 2006

(87) PCT Pub. No.: WO2005/121811

PCT Pub. Date: Dec. 22, 2005

(65) Prior Publication Data

US 2007/0163347 A1    Jul. 19, 2007

(30) Foreign Application Priority Data

May 5, 2004   (FR)   ................... 04 04794

(51) Int. Cl.
G01P 15/097 (2006.01)
(52) U.S. Cl. .................................... 73/514.29
(58) Field of Classification Search ............. 73/514.29, 73/514.15, 862.59
See application file for complete search history.

(56) References Cited

U.S. PATENT DOCUMENTS

| 4,216,402 A | 8/1980 | Engdahl |
| 5,962,786 A | 10/1999 | Le Traon et al. |

FOREIGN PATENT DOCUMENTS

FR   2 739 190   3/1997

*Primary Examiner*—John E Chapman
(74) *Attorney, Agent, or Firm*—Lowe Hauptman Ham & Berner LLP

(57) ABSTRACT

A sensor comprises two identical vibrating members operating with a common working frequency and joined to each other by a mechanical decoupling device. The device comprises a frame and two connecting bridges each supporting one member. The frame comprises a succession of mass portions and thinned portions so that the frequency of one mode of structural resonance of the frame is substantially equal to the common working frequency, and each connecting bridge is disposed in a node of vibration of the frame at the common working frequency. Thus, the vibrations of the two vibrating members are decoupled from each other.

8 Claims, 3 Drawing Sheets

MECHANICAL DECOUPLING DEVICE FOR MONOLITHIC DIFFERENTIAL VIBRATING SENSOR

REFERENCE TO RELATED APPLICATION

This application is a continuation of the PCT International Application No. PCT/FR2005/00988 filed Apr. 21, 2005, which is based on the French Application No. 0404794 filed May 5, 2004.

BACKGROUND OF THE INVENTION

1. Field of the Invention

The present invention relates generally to monolithic vibrating sensors operating in differential mode, i.e. consisting of two vibrating members attached to the same support. Their monolithic character is favorable to reducing their fabrication cost because it avoids assembling components and operation in differential mode aims to improve measurement accuracy by reducing the impact of parasitic input magnitudes that operate in common mode on both vibrating members.

The invention relates more particularly to a device for decoupling the mechanical vibrations of the two vibrating members to prevent the measurement accuracy from being degraded when the frequencies of the two vibrations are similar to each other.

2. Description of the Prior Art

According to U.S. Pat. No. 5,962,786 in the name of the applicant, a monolithic differential vibrating accelerometer AD' shown in FIG. 1 includes two substantially identical vibrating members $TA'_1$ and $TA'_2$ made from the same plate of material of uniform thickness. Each of the two vibrating members $TA'_1$ and $TA'_2$ is an accelerometric transducer including in particular a proof mass $2_1$, $2_2$, a resonator $3_1$, $3_2$ the resonant frequency whereof varies as a function of the acceleration applied along an axis substantially perpendicular to the plane of the plate, and a flexible frame $5_1$, $5_2$ connected by means of a single connecting bridge $7_1$, $7_2$ to the upper branch of a fixed part 1' having an I-shaped front contour. The transducers $TA'_1$ and $TA'_2$ are symmetrical to each other about the central axis YY' of the accelerometer AD'.

The fixed part 1' is intended to be fastened to the structure of a vehicle (not shown) via a case base BA'. Accordingly, the frequency variations of each of the two accelerometric transducers $TA'_1$ and $TA'_2$ are representative of acceleration variations to which the vehicle is subjected. The resonator $3_1$ is flush with one of the two faces of the plate and the resonator $3_2$ is flush with the other face, so that an acceleration applied perpendicularly to the plane of the plate causes an increase in the resonant frequency of one of the two resonators and a substantially equal decrease in the resonant frequency of the other resonator.

The accelerometer is generally also influenced by input magnitudes other than the acceleration to be measured. When these other input magnitudes, referred to as parasitic input magnitudes, operate in common mode on both transducers, which is the case of temperature variations, for example, they cause substantially identical variations in frequency of both resonators. The output magnitude of the accelerometer AD' being the difference between the two frequencies, it is clear that the influence of these parasitic input magnitudes may be significantly reduced and that the sensitivity of the accelerometer is substantially twice the sensitivity of the two transducers.

The function of each of the flexible frames $5_1$, $5_2$ is to provide a mechanical filter between the resonator $3_1$, $3_2$ and the fixed part 1' and, taking a simplified view, each frame may be considered as a filtering suspension the resonant frequency whereof is significantly lower than that of the resonator. To use an electrical analogy, this type of filtering corresponds to second order low-pass filtering. The fixed part 1' is therefore loaded very little by the vibrations of the resonator, the quality factor Q of which is therefore practically not degraded.

The mechanical design of the prior art accelerometer AD' has drawbacks, in particular with regard to the mechanical coupling between the vibrations of the two resonators when the frequencies of the two vibrations are close to each other. This is the case in particular if, seeking to produce an accelerometer of great accuracy, the aim is to make the two transducers $TA'_1$ and $TA'_2$ as nearly identical as possible in order to obtain the benefit of the maximum differential effect. As a result of this, the two frequencies cross over at an acceleration value within the measurement range of the accelerometer. As the crossing point of the frequencies approaches, a phenomenon of mechanical coupling occurs that is initially reflected in an increase in measurement noise and then by perfect identity of the two frequencies for acceleration values situated in a small area called the "measurement blind area". In this small area, the two frequencies are "locked" to each other, which prevents measurement of the acceleration. For example, for a prior art accelerometer AD' with dimensions for measuring accelerations of up to 100 g and the accuracy whereof, with a sufficient difference between the two frequencies, is typically of the order of $10^{-4}$ g, the blind area may reach 1 g, which corresponds to the accuracy of measuring an acceleration contained in this area being degraded by a factor of 10 000.

This very large factor by which the accuracy is degraded has three essential causes: the monolithic character of the accelerometer AD', the virtual absence of damping of the materials generally used to produce sensors of high accuracy, for example quartz or silicon, and the fact that the two connecting bridges $7_1$ and $7_2$ are connected directly together by the upper branch of the fixed part 1'. Accordingly, despite the mechanical filtering provided by the flexible frames $5_1$ and $5_2$ whereby the fixed part 1' is loaded very little by the vibrations of the resonators $3_1$ and $3_2$, the very low loading of each of these vibrating members is transmitted directly to the other vibrating member. Accordingly, when the two frequencies are close to each other, the effect of this very low loading is amplified by a factor close to the quality factor Q of the resonator of said other vibrating member, which is the cause of the mechanical coupling between the two resonators.

As their monolithic character and the nature of the materials used for these sensors cannot be modified, given the advantages already cited, the only possibility remaining is to improve the mechanical design of the device supporting the two vibrating members.

Thus, in this line of thinking, to solve the problem of the mechanical coupling between the two resonators, it might appear beneficial to take inspiration from the mechanical filtering function provided by a flexible frame of the same type as those $5_1$, $5_2$ shown in FIG. 1 in order to produce a mechanical filter between the two connecting bridges $7_1$ and $7_2$, as shown in FIG. 2, in which said connecting bridges are attached to a flexible frame 5 surrounding the two accelerometric transducers $TA'_1$ and $TA'_2$. This would produce the monolithic differential vibrating accelerometer ADa represented in FIG. 2 for which, to obtain the maximum efficacy of the filtering action of the flexible frame 5, and in accordance with the recommendations of the patent already cited, the plane P perpendicular to the plane of the frame 5 and passing through the two connecting bridges $7_1$ and $7_2$ is a plane of symmetry of the accelerometer ADa. However, the shape and the disposition of the flexible frame 5 shown in FIG. 2 would not be satisfactory for a monolithic differential vibrating accelerometer because the mechanical coupling between the two resonators $3_1$ and $3_2$ would not be reduced sufficiently. For example, for an accelerometer ADa with dimensions for measuring accelerations of up to 100 g and the accuracy whereof, for a sufficient distance between the two frequencies, is typically of the order of $10^{-4}$ g, the blind measuring area cannot be less than 0.1 g unless the flexibility of the flexible frame 5 is greatly increased, which would reduce unacceptably the lowest natural frequency and therefore the ruggedness of the accelerometer. This result, although a significant advance over the blind area of approximately 1 g of the accelerometer ADT from FIG. 1, is therefore a very long way from enabling the accuracy of $10^{-4}$ g to be achieved throughout the measurement range of the accelerometer, and the reader will have understood that the mechanical filtering function produced by the flexible frame 5 acting as a filtered suspension is not suitable for sufficiently reducing the mechanical coupling between the two resonators and therefore the blind measuring area.

OBJECT OF THE INVENTION

An object of this invention is to remedy this drawback of the prior art accelerometer shown in FIG. 1 and the accelerometer inspired by the patent already cited and shown in FIG. 2 by proposing a geometrical shape for the decoupling device integrated into the monolithic structure of the differential vibrating sensor to avoid mechanical coupling between the vibrations of the two vibrating members when the frequencies of the two vibrations are close to each other. It must be understood that the scope of the invention is not limited to accelerometers and that it extends more generally to sensors using two vibrating members operating constantly or occasionally at very similar frequencies, i.e. for which the relative frequency difference is less than 0.1% in practice. In this case of the proximity of the two frequencies, and in order to clarify the description of certain aspects of the invention, said frequencies will be designated the "common working frequency" of the two vibrating members.

SUMMARY OF THE INVENTION

According to the invention, the sensor machined in a plane plate including two substantially identical vibrating members operating in differential mode with a common working frequency and joined to each other by a mechanical device, symmetrical about an axis perpendicular to the plate, comprising a frame and two connecting bridges each supporting one member, is characterized in that the frame comprises a succession of mass portions and thinned portions so that the frequency of one mode of structural resonance of the frame is substantially equal to the common working frequency, and each connecting bridge is disposed in a node of vibration of the frame at the common working frequency, and the mechanical device has no plane of symmetry passing through the perpendicular axis.

Accordingly, at the common working frequency, it is the vibrations of the frame in response to the loading of each of the vibrating members that adapt spontaneously to prevent the two connecting bridges from vibrating, as a result of which the vibratory behavior of one vibrating member is substantially the same as if it were supported by means independent of that of the other vibrating member. Accordingly, as there is virtually no longer any mechanical coupling between the vibrations coming from the members, the accuracy of the measurement supplied by the differential sensor is improved.

In order for correct operation of the device to accommodate relatively wide fabrication tolerances, the two thinned portions on respective opposite sides of each of the two connecting bridges and closest to said connecting bridge preferably have very different mechanical flexibilities from each other.

To produce a compact sensor, the vibrating members are situated inside the frame.

BRIEF DESCRIPTION OF THE DRAWINGS

Other features and advantages of the invention will become more clearly apparent on reading the detailed description and from the related figures, in which:

FIG. 1 is a perspective view of a prior art monolithic differential vibrating accelerometer already commented on;

FIG. 2 is a perspective view of a monolithic differential vibrating accelerometer drawing its inspiration from the prior art and already commented on;

DESCRIPTION OF THE PREFERRED EMBODIMENTS

Figure 3:
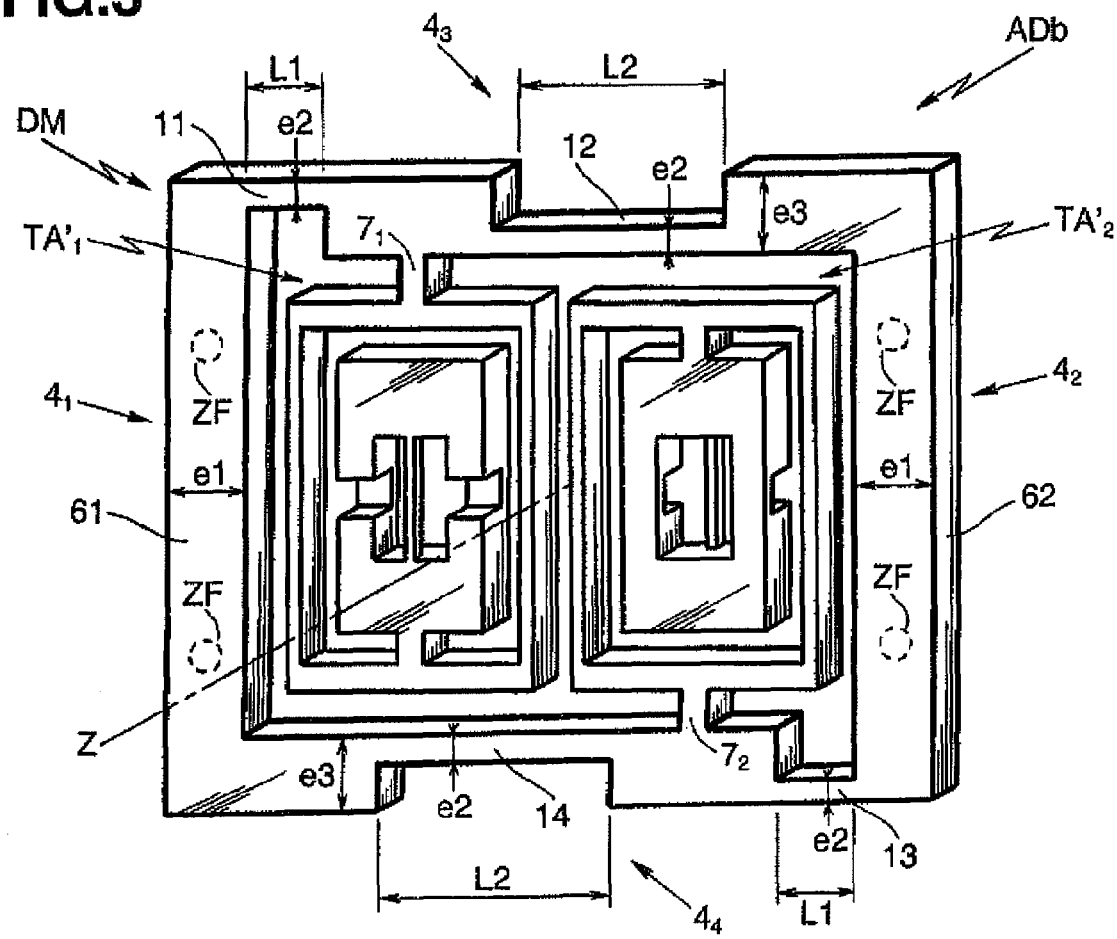
FIG. 3 is a perspective view of a monolithic differential vibrating accelerometer incorporating a first embodiment of a mechanical decoupling device of the invention.

Referring to FIG. 3, a mechanical decoupling device according to the invention connects two substantially identical vibrating members $TA'_1$ and $TA'_2$. The device takes the form of a frame DM surrounding the two vibrating members and two connecting bridges $7_1$ and $7_2$ each supporting one vibrating member. The frame DM, the two vibrating members $TA'_1$ and $TA'_2$ and the two connecting bridges $7_1$ and $7_2$ form a monolithic differential vibrating accelerometer body ADb. The frame DM and the two connecting bridges $7_1$ and $7_2$ form a plane structure having as an axis of symmetry the central axis Z perpendicular to the major faces of said structure. Said structure has no plane of symmetry containing the central axis Z.

Figure 1:
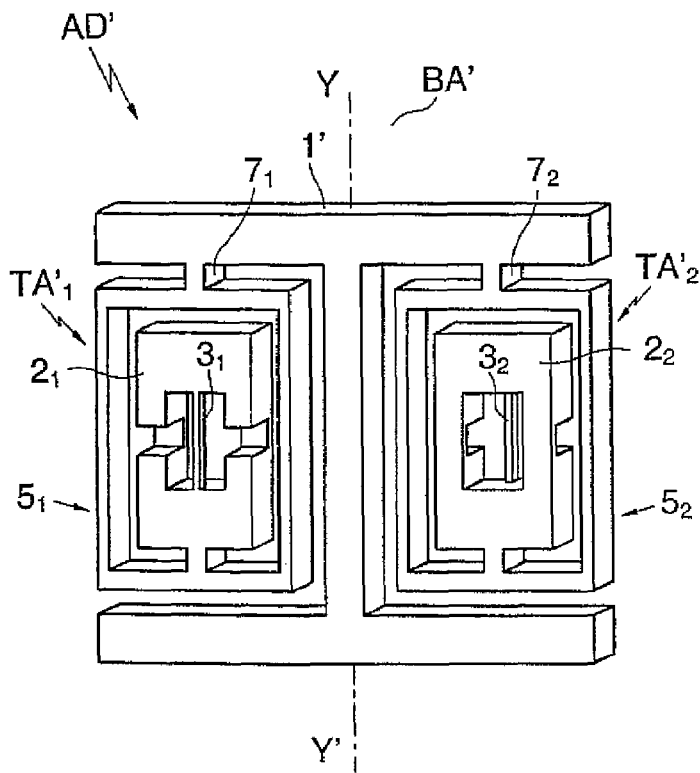

The monolithic accelerator body ADb may be made in a single step of chemically machining a plane plate of material, for example quartz or silicon, as explained in U.S. Pat. No. 5,962,786 with regard to the accelerometer AD' shown in FIG. 1. With regard to the structures produced in accordance with the present invention, chemical machining does not provide rigorous control over the shapes of the various components. The person skilled in the art will understand that this lack of precision must be taken into account when interpreting certain descriptive terms, for example the thicknesses of the members or the symmetry of the structure.

The frame DM, of rectangular general shape, consists of four sides $4_1$, $4_2$, $4_3$ and $4_4$. The sides $4_3$ and $4_4$ are disposed facing each other and each is fastened to a connecting bridge $7_1$, $7_2$. The sides $4_1$ and $4_2$ have a section dimension e1 in the plane of the frame DM. The section dimension is not constant along the other two sides $4_3$ and $4_4$ where material has been removed to produce thinned portions 11, 12, 13 and 14 the section dimension e2 whereof is significantly less than the section dimension e3 of the non-thinned portions of said sides. In the example illustrated, the dimension e2 is substantially equal to one third of the dimension e3. Generally speaking, the dimension e2 lies between one quarter and one half of the dimension e3. Each of the sides $4_3$ and $4_4$ has a thinned portion 11, 13 situated on one side of the connecting bridge $7_1$, $7_2$ that is fastened to it and having a length dimension L1, and a thinned portion 12, 14 situated on the other side of said connecting bridge and having a length dimension L2 significantly greater than L1. According to the example illustrated, the length dimension L2 is substantially equal to three times the length dimension L1. Generally speaking, the length dimension L2 lies between twice to ten times the length dimension L1. Accordingly, the thinned portions 12 and 14 with a length dimension L2 are significantly more flexible than the thinned portions 11 and 13 with a length dimension L1. It must be understood that this difference in flexibility, which constitutes a feature of the device according to the invention, may be obtained other than by virtue only of the difference between the length dimensions L1 and L2. Thus the section dimension of the thinned portions 11 and 13 may be different from the section dimension of the thinned portions 12 and 14.

In the example shown in FIG. 3, each of the sides $4_1$ and $4_2$ with a section dimension e1 is fastened to a non-thinned portion with a section dimension e3 of one of the other two sides $4_4$ and $4_3$ and forms with said non-thinned portion a mass portion 61, 62.

Thus the frame DM may be seen as essentially consisting of a succession of two mass portions (61, 62) and four thinned portions 11, 12, 13 and 14 disposed so that each of said mass portions is connected to each of the two connecting bridges via a thinned portion.

The accelerometer ADb is fixed, for example glued, to a case base (not shown) in four small circular areas ZF situated on one of the faces of the mass portions 61 and 62 of the frame DM, shown in dashed line in FIG. 3. It is important to emphasize that these four small fixing areas ZF make the accelerometer ADb sufficiently rigid in the measurement band, typically of order of 1000 Hz, and sufficiently flexible not to oppose the existence of a mode of structural resonance of the frame DM at a frequency close to the common working frequency of the two vibrating members, typically of the order 50 000 Hz, which could not be achieved if the whole of the face of the frame DM were fixed to the case base.

The frame DM has dimensions such that there exists a mode of structural resonance at the common working frequency such that at each of the connecting bridges $7_1$ and $7_2$ there are nodes of structural resonance of the frame. These dimensions may be determined by means of a theoretical model of the vibratory behavior of the frame, for example a three-dimensional finite-element model. The relative difference between the frequency of said structural resonance of the frame and the common working frequency of the two vibrating members is preferably less than 5%.

The operation of the mechanical decoupling device according to the invention is described next with reference to FIG. 4 which shows a simplified theoretical model with a single vibration axis x and consisting of masses and springs for simulating the vibratory mechanical behavior of the FIG. 3 accelerometer ADb. The description of FIG. 4 therefore relates to FIG. 3.

The two assemblies each constituted of a mass m and a stiffness k represent the two vibrating members $TA'_1$ and $TA'_2$ the common working frequency $F_0$ whereof is written:

$$F_0 = \frac{1}{2\pi}\sqrt{\frac{k}{m}}$$

Each of said assemblies is fastened at the level A, B on the axis x of two branches $b_1$ and $b_2$ each consisting of a mass M and two stiffnesses $K_1$ and $K_2$. The levels A and B represent the connecting bridges $7_1$ and $7_2$, respectively, and the branches $b_1$ and $b_2$ represent the frame DM, the mass portions 61 and 62 whereof are represented by the two masses M, the thinned portions 12 and 14 whereof are represented by the two stiffnesses $K_1$, and the thinned portions 11 and 13 whereof are represented by the two stiffnesses $K_2$ of significantly higher value than $K_1$.

Figure 4:
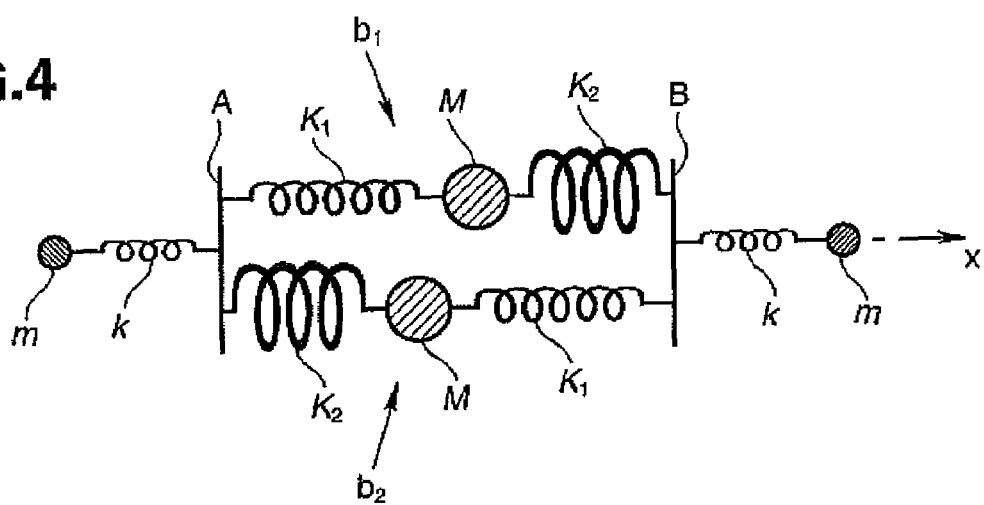
FIG. 4 represents a simplified theoretical model consisting of masses and springs used to explain the operation of the mechanical decoupling device of FIG. 3.

The mass-spring model of FIG. 4 represents appropriately certain important aspects of the mechanical configuration of the structure formed by the frame DM and the two connecting bridges $7_1$ and $7_2$, in particular with regard to the difference in flexibility between the thinned portions 12, 14 and the thinned portions 11, 13, with regard to the fact that each of the mass portions is joined to each of the two connecting bridges via a thinned portion, and with regard to the symmetry with respect to the central axis Z and the absence of symmetry with respect to a plane containing said axis.

In order for the two branches $b_1$ and $b_2$ of the FIG. 4 mass-spring model to simulate the mechanical behavior of the frame DM according to the invention, it is further necessary for the masses M and the stiffnesses $K_1$ and $K_2$ to be adjusted so that the resonant frequency $F_b$ of the branches $b_1$ and $b_2$, considered as built-in beams at the levels A and B, to be equal to the common working frequency $F_0$:

$$F_b = \frac{1}{2\pi}\sqrt{\frac{(K_1 + K_2)}{M}} = F_0$$

Given these adjustments, the classic equations translating the dynamic equilibrium of the masses m and M can be used to show that, in a simulation of the real situation in which the levels A and B are free to move, the vibration of either of the two assemblies each consisting of a mass m and a stiffness k causes vibrations of the branches $b_1$ and $b_2$ that adapt spontaneously to hold the levels A and B immobile. Accordingly, each of said assemblies vibrates as if it were built in at the level (A, B). Accordingly, the vibrations of said assemblies are independent of each other and there is therefore no mechanical coupling between said vibrations. The classic equations for the dynamic equilibrium of the masses m and M can also be used to show that this absence of mechanical coupling between said vibrations can be obtained only if the stiffnesses $K_1$ and $K_2$ are different from each other, which reflects the necessity for the absence of symmetry with respect to a plane containing the central axis Z in the structure formed by the frame DM and the two connecting bridges $7_1$ and $7_2$. Similarly, said absence of mechanical coupling can be obtained only if each assembly constituted of a mass m and a stiffness k is fastened at only one level (A, B) to the two branches $b_1$ and $b_2$, which explains why each of the two vibrating members must be connected to the mechanical decoupling device according to the invention through a single connecting bridge.

To use an electrical analogy, it is possible to see the operation of the device according to the invention as that of a trap circuit tuned to eliminate an electrical signal at a particular frequency.

Figure 2:
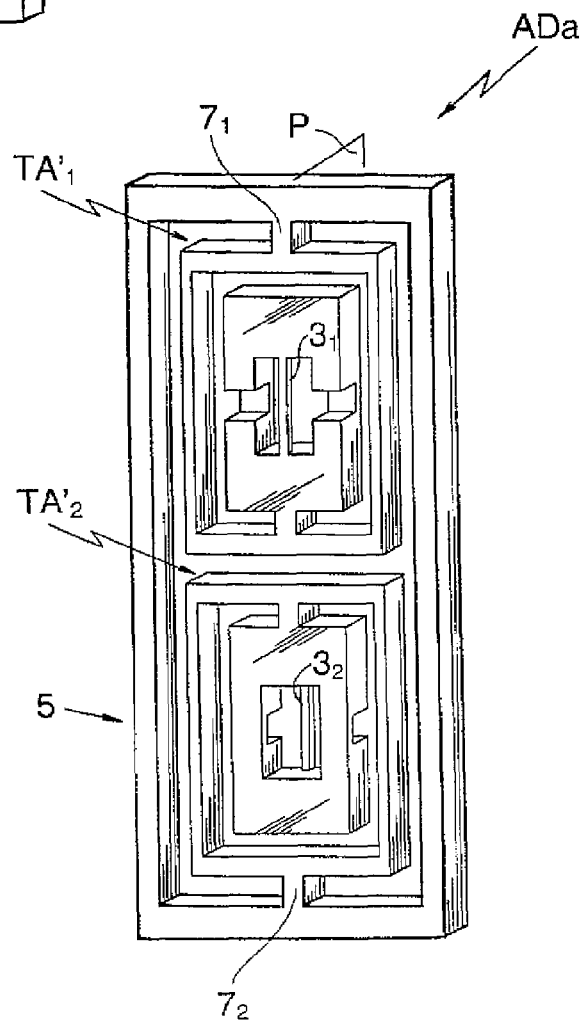

Thanks to its operating principle, the efficacy of the mechanical decoupling device of the invention is able to accommodate a high natural frequency of the accelerometer ADb, in contrast to the accelerometer ADa of FIG. 2 taking its inspiration from the prior art, for which the efficacy of the mechanical filtering effect procured by the frame 5 is inversely proportional to the natural frequency of said frame, as explained hereinabove by means of the electrical analogy of the second order low-pass filter.

It is therefore possible to produce an accelerometer ADb including a mechanical decoupling device according to the invention with dimensions selected to measure accelerations of up to 100 g, the blind zone whereof is less than $10^{-4}$ g, and the lowest natural frequency whereof is 3 000 Hz, a value high enough to ensure that the accelerometer is sufficiently rugged for many applications.

The simplified theoretical model shown in FIG. 4 also yields a further teaching that can be applied to the mechanical decoupling device according to the invention and concerns the manufacturing tolerances of said device. In practice, it is desirable for the fabrication cost of the differential sensor including the mechanical decoupling device according to the invention not to be burdened by any additional cost linked to the difficulty of producing said device with sufficient geometrical precision to obtain the required efficacy. The classic equations reflecting the dynamic equilibrium of the masses m and M of the FIG. 4 theoretical model can be used to show that the production tolerances of the device according to the invention are proportional to $(K_1-K_2)^2/K_1K_2$. It is deduced from this that said production tolerances are directly proportional to the difference between the stiffnesses $K_1$ and $K_2$. This is why, in the case of the mechanical decoupling device shown in FIG. 3, the thinned portions 12 and 14 are significantly more flexible than the thinned portions 11 and 13. In practice, this means that the production tolerances of said device can be of the order of a few μm, which is compatible with the precision of the processes conventionally employed for the chemical machining of small sensors.

Figure 5:
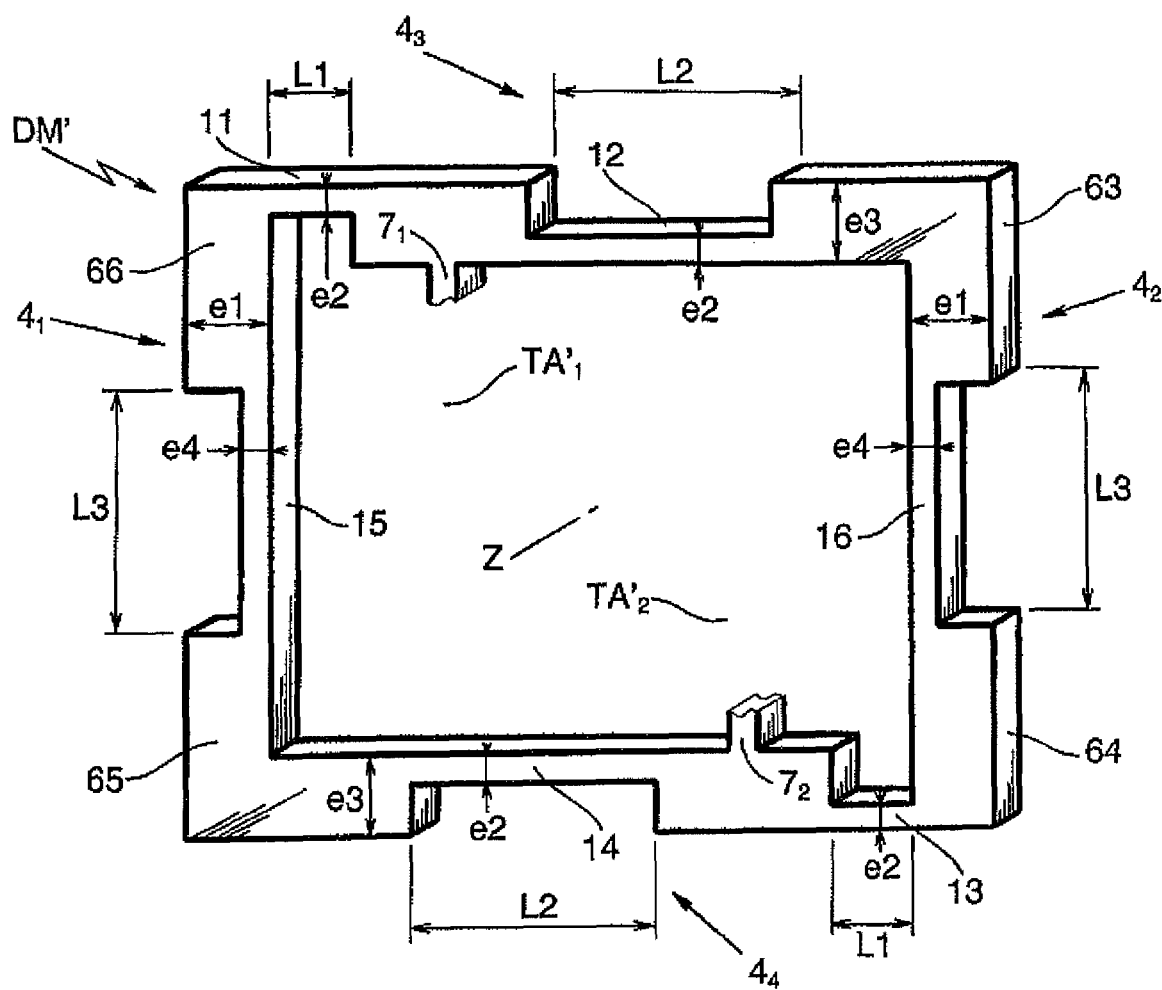
FIG. 5 is a perspective view of another embodiment of a mechanical decoupling device conforming to the invention.

FIG. 5 shows another embodiment of a mechanical decoupling device of the invention. Like the device represented in FIG. 3, the FIG. 5 device takes the general form of a rectangular frame DM' consisting of four sides $4_1$, $4_2$, $4_3$ and $4_4$ and which differs from the FIG. 3 frame DM mainly through a greater number of mass portions and thin portions. More precisely, material has been removed on the sides $4_1$ and $4_2$ to obtain the thinned portions 15 and 16 the section dimension e4 whereof in the plane of the frame DM' is significantly less than the section dimension e1 of the non-thinned portions of said sides. According to the example shown, the dimension e4 is substantially equal to one third of the dimension e1. Generally speaking, the dimension e4 lies between one quarter and one half of the dimension e1. Again in accordance with the example shown, the length L3 of the thinned portions 15 and 16 is significantly equal to the length L2 of the thinned portions 12 and 14 of the other two sides $4_3$ and $4_4$. Generally speaking, L3 lies between one half and twice L2.

Again in the example shown in FIG. 5, a non-thinned portion of each of the sides $4_1$ and $4_2$ is attached to a non-thinned portion of one of the other two sides $4_4$ and $4_3$ and with said non-thinned portion forms a mass portion (65, 63), the other non-thinned portion of each of the sides $4_1$ and $4_2$ forming on its own a mass portion (66, 64).

Thus the frame DM' can be seen as consisting essentially of a succession of four mass portions (63, 64, 65, 66) and six thinned portions (11, 12, 13, 14, 15, 16).

Theoretical study of the vibratory behavior of the frame DM', effected by means of a simplified theoretical model with only one vibration axis and consisting of four masses and six springs, for example, shows that the increased number of mass portions and thinned portions, compared to the frame DM represented in FIG. 3, significantly widens the production tolerances necessary for correct operation of the device, although on condition that, as for the frame DM, the two thinned portions (11 and 12, 13 and 14) situated on respective opposite sides of each of the two connecting bridges ($7_1$, $7_2$) and closest to said connecting bridge have very different mechanical flexibilities from each other. It must nevertheless be noted that, although it might appear beneficial in the light of the mass-spring model studies to increase further the number of mass portions and thinned portions, this is not the case in reality, as this would lead to producing a device in which the dissociation between said portions would be less clear than in the case of the frames DM and DM', said device not procuring any significant improvement compared to the frames DM and DM'. In practice, the frames DM and DM' enable effective embodiments of mechanical decoupling devices according to the invention, the greater production tolerances of the frame DM' enabling it to be fabricated with simpler methods that are therefore less costly to use than in the case of the frame DM.

The invention claimed is:

1. A sensor machined in a plane plate including two substantially identical vibrating members operating in differential mode with a common working frequency and joined to each other by a mechanical device, symmetrical about an axis perpendicular to said plate, said mechanical device comprising a frame and two connecting bridges respectively supporting said vibrating members, said frame comprising a succession of mass portions and thinned portions and being dimensioned by means of a theoretical model of vibratory behavior of said frame so that the frequency of one mode of structural resonance of said frame is substantially equal to said common working frequency, each connecting bridge being disposed in a node of vibration of said frame at said common working frequency, and said mechanical device having no plane of symmetry passing through said perpendicular axis.

2. A sensor according to claim 1, wherein two of said thinned portions are on respective opposite sides of each of the two connecting bridges and closest to said each connecting bridge and have very different mechanical flexibilities from each other.

3. A sensor according to claims 1, wherein said frame surrounds said two vibrating members.

4. A sensor according to claims 1 wherein the frame comprises first sides and second sides disposed as a rectangular general shape, said first sides being disposed facing each other and fastened respectively to a said connecting bridges, and each of said first sides having two thinned portions on opposite sides of the respective connecting bridges.

5. A sensor according to claim 4, wherein said thinned portions of said first sides fastened respectively to said connecting bridges have a section dimension in the plane of the frame lying between one quarter and one half of the section dimension of non-thinned portions of said two sides.

6. A sensor according to claim 5, wherein two of said thinned portions are on respective opposite sides of each of the two connecting bridges and closest to said each connecting bridge and have length dimensions very different therebetween, the greatest of said length dimensions lying between twice times and ten times the other length dimension.

7. A sensor according to claim 6, wherein said second sides each have a thinned portion having a section dimension in the plane of the frame lying between one quarter and one half of the section dimension of non-thinned portions of said second sides.

8. A sensor according to claim 7, wherein the length dimension of the thinned portions of said second sides lies between one half and twice of the length dimension of the longest of the two thinned portions on respective opposite sides of each of said two connecting bridges and closest to said each connecting bridge.

* * * * *